Figure 1:
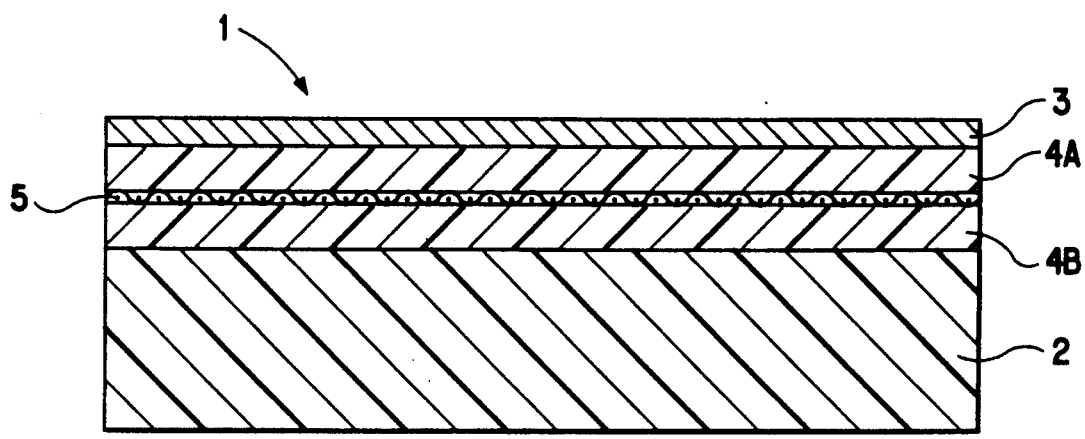

United States Patent [19]

Chow et al.

[11] Patent Number: 5,243,126

[45] Date of Patent: Sep. 7, 1993

[54] CONDUCTIVE PANEL

[75] Inventors: Suezone Chow, Richmond; Romulo C. Casilla, Vancouver, both of Canada

[73] Assignee: Canadian Forest Products Ltd., Vancouver, Canada

[21] Appl. No.: 646,583

[22] Filed: Jan. 28, 1991

[30] Foreign Application Priority Data

Jan. 30, 1990 [GB] United Kingdom ............... 9002073

[51] Int. Cl.⁵ .................... H05K 9/00; B21D 39/00
[52] U.S. Cl. ................. 174/35 MS; 428/623; 428/478.8; 428/479.6
[58] Field of Search ............. 174/35 R, 35 MS; 428/621, 622, 623, 478.8, 479.6, 528, 530, 511

[56] References Cited

U.S. PATENT DOCUMENTS 2,498,493  2/1950  Hickernell .............. 174/35 MS

FOREIGN PATENT DOCUMENTS 57-176152 10/1982 Japan .
59-202849 11/1984 Japan .
1477658  6/1977 United Kingdom .
1577905 10/1980 United Kingdom .

*Primary Examiner*—Leo P. Picard
*Assistant Examiner*—Bot L. Ledynh
*Attorney, Agent, or Firm*—Richard H. Burgess

[57] ABSTRACT

A panel is disclosed that is formed from a planar, substantially inflexible cellulosic substrate having a rough or uneven surface, at least one layer of paper or veneer and a layer of an electrically conductive wire mesh or metal foil interposed between the substrate and the layer of paper or veneer. The substrate and the layers are bonded together with a layer of a polyolefin that has been grafted with an ethylenically unsaturated carboxylic acid or anhydride. The polyolefin is a homopolymer of ethylene or copolymer of ethylene and a higher hydrocarbon alpha-olefin. Processes for the manufacture of the panel are also disclosed. The panel may be used in the construction industry, especially as electrical shielding or for the removal of stray electrical currents from electrical or other equipment.

6 Claims, 1 Drawing Sheet

CONDUCTIVE PANEL

The present invention relates to a conductive panel, especially in the form of a construction panel, formed from a substantially inflexible planar cellulosic substrate, at least one layer of paper or veneer, and an interposed layer of electrically conductive wire mesh or metal foil, the layers being bonded together using a grafted polyolefin. In particular, the panel is formed from a substrate that is obtained from particles or flakes or other wood fragments.

In the construction of houses and other buildings, it is known to use a variety of types of construction panels for walls, flooring and other surfaces. In some instances, it is intended that rooms or portions of the houses or other buildings be used for the operation of electrical or electronic equipment, including computers. Such operations may be sensitive to stray electrical signals that originate from natural sources or from other electrical or electronic equipment. Under such circumstances, it may be important or even critical to screen the equipment from stray electrical signals.

Panels formed from a substantially inflexible cellulosic substrate and a layer of paper or veneer, with an interposed layer of grafted polyolefin, are disclosed in the copending U.K. patent application No. 89.025813 of S. Chow and D. H. Dawes, filed Nov. 15, 1989. That application discloses construction panels formed from, for instance, particleboard, fibreboard, oriented strandboard (OSB), hardboard, other similar boards formed from wood that may not otherwise be usable in the construction industry and boards formed from particles, chips, flakes or other fragments of wood.

It has now been found that a construction panel useful in the building industry, and especially for interior surfaces of buildings that require electrical screening properties, may be formed from a substantially inflexible cellulosic substrate having a rough or uneven surface and at least one layer of paper or veneer, with an interposed layer of a wire mesh or metal foil.

Accordingly, the present invention provides a panel consisting essentially of:
a) a planar substantially inflexible cellulosic substrate having a rough or uneven surface; and
b) at least one layer of paper or veneer;
c) a layer of an electrically conductive wire mesh or metal foil interposed between said substrate and said at least one layer;
said substrate and said layers being bonded together with a polyolefin selected from the group consisting of (i) homopolymers of ethylene and copolymers of ethylene and at least one $C_4$–$C_{10}$ hydrocarbon alpha-olefin, and mixtures thereof, and having a melt index of less than 20 dg/min, (ii) copolymers of ethylene with at least one of vinyl acetate, acrylic acid, methacrylic acid, carbon monoxide, alkyl esters of acrylic acid and alkyl esters of methacrylic acid, and (iii) copolymers of ethylene with at least one unsaturated carboxylic acid, and mixtures of said polyolefins, said polyolefins of (i) and (ii) having been grafted with at least 9 ppm by weight of an ethylenically unsaturated carboxylic acid or anhydride.

In a preferred embodiment of the panel of the present invention, the layer of paper or veneer is kraft paper.

The present invention also provides a process for the manufacture of a panel consisting essentially of:
a) a planar substantially inflexible cellulosic substrate having a rough or uneven surface; and
b) at least one layer of paper or veneer;
c) a layer of an electrically conductive wire mesh or metal foil interposed between said substrate and said at least one layer;
said substrate and said layers being bonded together with a polyolefin selected from the group consisting of (i) homopolymers of ethylene and copolymers of ethylene and at least one $C_4$–$C_{10}$ hydrocarbon alpha-olefin, and mixtures thereof, and having a melt index of less than 20 dg/min, (ii) copolymers of ethylene with at least one of vinyl acetate, acrylic acid, methacrylic acid, carbon monoxide, alkyl esters of acrylic acid and alkyl esters of methacrylic acid, and (iii) copolymers of ethylene with at least one unsaturated carboxylic acid, and mixtures of said polyolefins, said polyolefins of (i) and (ii) having been grafted with at least 9 ppm by weight of an ethylenically unsaturated carboxylic acid or anhydride; said process comprising contacting each of said surface of the cellulosic substrate, said layer of electrically conductive wire mesh or metal foil and said layer of form a sandwich of said substrate and layers with the layer of wire mesh or metal foil interposed between the substrate and the at least one layer of paper or veneer, heating the resultant sandwich of layers to a temperature of at least 130° C. under pressure for a period of at least 60 seconds to effect bonding of the polyolefin to the cellulosic substrate, to the paper or veneer and to the wire mesh or metal foil, removing and cooling the panel so formed In an embodiment of the invention, the process is a continuous process.

The present invention further provides a process for the manufacture of a panel consisting essentially of:
a) a planar substantially inflexible cellulosic substrate having a rough or uneven surface; and
b) at least one layer of paper or veneer;
c) a layer of an electrically conductive wire mesh or metal foil interposed between said substrate and said at least one layer;
said substrate and said layers being bonded together with a polyolefin selected from the group consisting of (i) homopolymers of ethylene and copolymers of ethylene and at least one $C_4$–$C_{10}$ hydrocarbon alpha-olefin, and mixtures thereof, and having a melt index of less than 20 dg/min, (ii) copolymers of ethylene with at least one of vinyl acetate, acrylic acid, methacrylic acid, carbon monoxide, alkyl esters of acrylic acid and alkyl esters of methacrylic acid, and (iii) copolymers of ethylene with at least one unsaturated carboxylic acid, and mixtures of said polyolefins, said polyolefins of (i) and (ii) having been grafted with at least 9 ppm by weight of an ethylenically unsaturated carboxylic acid or anhydride; said process comprising feeding cellulosic fragments to conveying means, said conveying means being planar and said fragments being coated with a binder resin in an amount adapted to effect bonding of the flakes together under the influence of heat and pressure to form said cellulosic substrate, sequentially feeding thereon a first layer of said polyolefin, a layer of the wire mesh or metal foil, a second layer of said polyolefin and a layer of paper or veneer, passing the resultant sandwich of layers to heating and pressure means and heating the sandwich to a temperature of at least 130° C. under pressure for a period of at least 60 seconds to effect bonding of the polyolefin to the cellulosic substrate, wire mesh or metal foil and the paper or veneer, and cooling the panel so formed.

In a preferred embodiment of the processes of the present invention, at least the first layer of polyolefin is in the form of a film.

In another embodiment, the second layer of polyolefin is a coating on the layer of paper or veneer.

The present invention relates to a panel formed from a cellulosic substrate and paper or veneer, with an interposed layer of electrically conductive wire mesh or metal foil, bonded together with a grafted polyolefin.

The panel of the present invention will be generally described herein with reference to a construction panel.

The invention is illustrated in FIG. 1. The conductive panel, generally indicated by 1, has a cellulosic substrate 2 having thereon an outer layer 3 of paper or veneer. Interposed between cellulosic 2 and outer layer 3 is bonding layer 4 (shown as 4A and 4B) having therein mesh or foil layer 5. When layer 5 is in the form of a foil, the conductive panel 1 will have, in sequence, layers of cellulosic substrate 2, bonding layer 4B, foil layer 5, bonding layer 4B and outer layer 3. When layer 5 is in the form of a mesh, bonding layers 4A and 4B will be united into a single layer in the interstices formed by the wires of the mesh, in addition to the enveloping of the wires of the mesh.

The substrate is a substantially inflexible cellulosic substrate i.e. it will have structural integrity, be capable of being flexed to only a minor degree and be formed from a wood product. The cellulosic substrate may have been formed from particles, chips, flakes, sawdust, paper and/or other fragments of wood. The fragments of wood may be derived from a variety of trees, including both hardwood and softwood trees. Examples of such trees include, but are not limited to, aspen, beech, birch, cedar, Douglas and other firs, hemlock, pine and spruce in Canada, but in other countries could be exemplified by other types of trees used or potentially usable in the construction industry The actual form of the cellulosic substrate may be varied widely; as used herein, "planar substantially inflexible cellulosic substrate" is understood to include particleboard, OSB, waferboard, plywood, fibreboard, hardboard, chipboard and the like. The wood product is described herein as having an uneven or rough surface, and the wood products described above generally are formed with such a surface. Such surfaces are normally not capable of being coated, especially painted, to provide a high quality smooth and/or an attractive outer surface.

Techniques for the manufacture of the substrates are known in the art. For instance, the substrates may be obtained from wood fragments using a press. A bonding agent is normally applied to the surface of the wood fragments, examples of such bonding agents being urea/formaldehyde resin, phenol/formaldehyde resin, melamine/formaldehyde resin, polymeric isocyanate resin and the like. The bonding agent, which is preferably in a powder form rather than a liquid form and is preferably a phenol/formaldehyde resin, is typically applied in amounts in the range of 1.8 to 2.3%, on a weight basis, of wood fragments. In addition, a wax e.g. a petroleum wax, may also be applied to the wood fragments, typically in amounts in the range of 1-2%, on a weight basis, of the wood fragments, to improve water resistant properties. Preservatives and other additives may also be applied to the wood fragments, as is known.

The outer layer of the construction panel is formed from paper or veneer. A wide variety of papers may be used, but it is preferred that the paper be a kraft paper. The kraft may be bleached kraft paper, but is preferably unbleached kraft paper. The paper may be used in a variety of thicknesses, depending in particular on the thicknesses of paper that are commercially available. In addition, the particular process of manufacture of the construction panels of the invention, including the nature of the wood fragments used in that process, may be factors in the selection of the thickness of the paper, as some processes may impose higher demands on strength properties of the paper in order to resist puncture during manufacture. Preferred thicknesses of kraft paper are 3 and 6 mils i.e. 75 and 150 microns respectively.

Alternatively, the outer layer of the construction panel may be a veneer i.e. a thin layer of wood covering the surface of the construction panel. Methods for the manufacture of veneers are known, and may be obtained from a variety of types of trees. Examples of such trees include birch, Japanese cypress and yellow cedar, but other trees may be usable.

A layer of wire mesh or metal foil is located between the cellulosic substrate and the layer of paper or veneer. The layer of wire mesh or metal foil is electrically conductive. Examples of wire mesh are commercially available e.g. wire mesh formed from steel, copper, aluminum, brass, phosphor, bronze and phosphor-bronze. The thickness or wire diameter, opening size and mesh number of the wire mesh may be varied over a wide range, but it will generally be preferred to use a wire mesh of relatively low thickness to facilitate formation of the construction panel of the invention.

Examples of electrically conductive metal foil are also commercially available, and include copper and brass foil, and especially aluminum foil. The thickness of the metal foil may be varied over a wide range e.g. in the range of 10 to 800 microns, especially 14 to 125 microns.

The polyolefin of the interlayer may be a homopolymer of ethylene or a copolymer of ethylene with at least one $C_4$-$C_{10}$ hydrocarbon alpha-olefin, or mixtures thereof. The preferred copolymers are copolymers of ethylene with butene-1, hexene-1 and/or octene-1. The density of the polymers may be varied over a wide range e.g. in the range of from about 0.890 g/cm$^3$ to about 0.970 g/cm$^3$. The melt index of the polymer, as measured by the procedure of ASTM D-1238 (Condition E, also known as 190/2.16) is less than 20 dg/min. If the polymer is used in the form of film, as discussed herein, the polymer preferably has a density in the range of 0.905 to 0.940 g/cm$^3$, with the melt index preferably being in the range of 0.35-5.5 dg/min, especially in the range 0.60-2.5 dg/min. If the polymer is used in the form of a coating, as discussed herein, the polymer preferably has a density in the range of 0.915 to 0.925 g/cm$^3$, with the melt index preferably being in the range of 2-20 dg/min, especially 5-15 dg/min. In alternative embodiments, the polyolefin that is grafted is a copolymer of ethylene with vinyl acetate, acrylic or methacrylic acid, carbon monoxide or alkyl esters of acrylic and methacrylic acid, and mixtures thereof.

The monomer that is grafted onto the polyolefin is an ethylenically unsaturated carboxylic acid or derivative thereof. The grafting monomer is selected from the group consisting of ethylenically unsaturated carboxylic acids and ethylenically unsaturated carboxylic acid anhydrides, including derivatives of such acids. Examples of the acids and anhydrides, which may be mono-, di- or polycarboxylic acids, are acrylic acid, methacrylic acid, maleic acid, fumaric acid, itaconic acid, crotonic acid, itaconic anhydride, maleic anhydride and substituted maleic anhydride e.g. dimethyl maleic anhydride, nadic anhydride, nadic methyl anhydride and tetrahydro phthalic anhydride. Examples of derivatives of the unsaturated acids are salts, amides, imides and esters e.g. mono- and disodium maleate, acrylamide, maleimide, glycidyl methacrylate and diethyl fumarate.

The amount of grafted monomer of the polyolefin may also be over a wide range, but should be at least 9 ppm by weight of the polyolefin. In embodiments, the amount of grafted monomer may be as high as 5% by weight, especially 0.01–0.2% by weight and in particularly in the range of 0.02–0.15% by weight. Grafted polyolefins are available commercially e.g. under the trademark Fusabond from Du Pont Canada Inc. In addition, methods for the grafting of monomers onto polyolefins are disclosed in U.S. Pat. No. 4,612,155 of C. S. Wong and R. A. Zelonka, issued Sep. 16, 1986. The amount of graft monomer in the polyolefin used according to the present invention may be obtained by grafting the required amount onto the polyolefin or by blending a polymer having a higher level of graft monomer with un-grafted polyolefin or polyolefin with a low level of graft monomer. In alternative embodiments, the graft polyolefin may be replaced with an acid copolymer e.g. a copolymer of ethylene and an unsaturated carboxylic acid, examples of which are ethylene/acrylic acid and ethylene/methacrylic acid copolymers, or with ionomers of such copolymers. Examples of both the acid copolymers and ionomers are commercially available.

The construction panels of the invention may be manufactured using a variety of methods. For instance, the cellulosic substrate may be extrusion coated with grafted polyolefin, wire mesh or metal foil laid on top of the grafted polyolefin coating, a second layer of grafted polyolefin added and then the layer of paper or veneer applied on top. The resulting sandwich of layers is then heated, preferably under pressure in a press or between rolls, to effect bonding of the layers of grafted polyolefin to the cellulosic substrate, mesh or metal foil and the paper or veneer. The grafted polyolefin layer is heated to a temperature above the melting point of the grafted polyolefin in order to effect bonding i.e. to a temperature in excess of 130° C. and especially in the range of about 150° to 200° C.

Alternatively, the paper or veneer may be extrusion coated with the grafted polyolefin. The coated paper or veneer could then be contacted with mesh or metal foil already bonded to a grafted polyolefin coating on the cellulosic substrate, and subjected to heat and pressure to effect bonding, as discussed above. Alternatively, a laminate of paper or veneer, grafted polyolefin, wire mesh or metal foil and further grafted polyolefin may be formed, which would then be bonded to the cellulosic substrate using heat and pressure. In a further embodiment, the cellulosic substrate, films of the grafted polyolefin, the wire mesh or metal foil and the layer of paper or veneer are brought into contact in the proper sequence and subjected to heat and pressure to effect bonding.

In an alternative method, the panels may be manufactured in a one-step process. In such a process, a layer of paper is fed onto a screen or other support surface. A layer of the polyolefin film is then fed on top of the paper, it being understood that the layer of paper may actually have the layer of polyolefin film coated thereon. The wire mesh or metal foil is then laid onto the polyolefin film followed by another layer of the polyolefin film. A layer of wafers or other fragments of wood is then laid onto the polyolefin film, in an amount to provide a substrate of the required thickness. The wafers would normally be coated or admixed with a binder e.g. a phenol/formaldehyde resin. A further polyolefin film and a second layer of paper or veneer could then optionally be fed onto the wafers. The resultant assembly of layers is fed between heated rollers that heat the assembly, under pressure, to a temperature sufficient to effect bonding of the layers to the extent that a panel is formed. Such a one-step process may be operated in a continuous manner. In another embodiment, the one step process is operated by feeding cellulosic fragments e.g. wafers, to conveying means and sequentially adding the other layers on top of the fragments, and then pressing as described above.

The conductive construction panels of the invention may be used in a variety of end-uses, especially where stray electrical currents could pose potential problems in the operation of equipment e.g. as the interior surfaces of buildings. Panels coated with paper may be painted to provide an attractive surface, the layer of paper providing a surface that is capable of being painted while the interposed layer of grafted polyolefin provides a smooth surface that tends to cover defects e.g. roughness or unevenness, in the surface of the cellulosic substrate. The layer of paper may also be decorated in other manners. Panels coated with veneer may be shellacked or coated with varnish or the like, to preserve and enhance the attractive features of the veneer. The panels may be nailed and are capable of accepting paintings and other wall decorations. The panels may also be used as sub-layers in the construction industry, to provide barriers to moisture or the like and to provide a surface that is capable of having other layers adhered thereto, as well as providing the electrical properties. It is to be understood that the panels would need to be grounded, or interconnected and grounded in order to remove the stray electrical currents.

The invention is illustrated by the embodiments in the following examples

EXAMPLE I

Tests were carried out to compare the bending strength and stiffness of panels with those of the uncoated substrate. The substrate was OSB measuring 0.63 ×37.5×37.5 cm. The films of grafted polyolefin were formed from polyethylene grafted with 0.045% of maleic anhydride, and had not been treated with an electric discharge; film thickness was 25 microns. The wire mesh was aluminum with a thickness of 0.57 mm, an opening of 1.3×1.7 mm and a mesh number of 13 or 18. The outer layer was kraft paper. The panels were comprised of cellulosic substrate which had been coated on both sides with polyolefin film, wire mesh, polyolefin film and kraft paper.

A panel was formed by pressing a sandwich corresponding to the construction of the panel in a 45×45 cm hot press using a platen temperature of 150° C., pressure of 200 psi (1.38 Mpa) and pressing time of 1 minute. The panel surface was rolled immediately after removal from the press. Bending test specimens measuring 4.69×20 cm ×(panel thickness) were prepared from the coated panel and from the uncoated substrate in such a way that the tests would be conducted in a direction parallel to the strand orientation in the OSB.

All of the bending specimens were tested according to ASTM procedure D-1037 using an Instron ® apparatus; modulus or rupture ("MOR") and modulus of elasticity ("MOE") were calculated for each test specimen.

The results showed that the panel had a modulus of rupture of 5900 psi (40.7 MPa) and a modulus of elasticity of 755 000 psi (5210 MPa), compared with 5000 psi (34.5 MPa) and 848 000 psi (5850 MPa) for the uncoated panel.

From the results obtained, it appears that there was no significant difference in bending strength (MOR) and stiffness (MOE) between the coated panel and uncoated substrate.

EXAMPLE II

The electromagnetic shielding effectiveness of fibreboards overlaid with a combination of polyethylene film, kraft paper and wire mesh was determined.

Commercial wood fibres mixed with liquid phenol formaldehyde resin (1% by weight based on the oven-dry weight of wood fibres) were formed into 3.7×120×240 cm wet mats and sprayed with wax solution (0.1% by weight based on the oven-dry weight of wood fibres). The mat was cut into 30×30 cm samples for overlaying. Only one surface was overlaid, in the following sequence: polyethylene film, wire mesh, polyethylene film and kraft paper. The polyethylene film was in sheet form and formed from a grafted polyethylene similar to that used in Example I, had a thickness of 50 microns and had not been treated with an electric discharge. Two types of wire mesh were used viz. aluminum alloy having a thickness of 0.57 mm and a mesh size of 13×18 mm, and copper having a thickness of 0.52 mm and a mesh size of 16×16 mm.

The wet mat-overlay was pressed on an 45×45 cm hot press at a platen temperature of 191° C. with a screen placed underneath to facilitate removal of water from the mat overlay. The pressing schedule was as follows: 0–0.9 minutes at 600 psi (4.14 MPa); 0.9–3 minutes at 75 psi (0.52 MPa) and 3–6 minutes at 200 psi (1.38 Mpa). The resultant panel thickness was approximately 6.5 mm. Panels formed from the wood fibres alone were also pressed, for use as control samples.

Three panels were used in the shielding effectiveness tests, one with copper mesh, one with aluminum mesh and the control. Two test specimens were prepared from each panel, one for measurement of so-called near field attenuation and the other for measurement of so-called far field attenuation.

For the near field attenuation test, the specimen measured 3×90×155 mm; the thickness was obtained by filing off part of the wood fibre from the side of the panel opposite the wire mesh. 15 mm of wire mesh were exposed around the outside of the specimen and folded back over the wood fibre.

For the far field attenuation test, the specimen had the shape of a washer with an outside diameter of 100 mm and an inside hole diameter of 45 mm. 10 mm of wire mesh were exposed around the outside of the specimen and folded around the edge of the wood fibre. The wire mesh remained in the hole; the centre of the wire mesh was cut radially to allow the centre conductor of the test fixture to pass through.

For all specimens, the exposed wire mesh was cleaned and painted with a silver-bearing paint.

The specimens were tested for near field and far field shielding effectiveness or attenuation using the dual chamber and transmission line methods, respectively, over the frequency range of 30 to 1000 MHz, according to the procedures of ASTM ES7-83. The testing was carried out in an RF Anechoic Chamber using a spectrum analyzer, attenuators, power amplifier, signal generator and near field and far field test fixtures.

The results obtained are given in Table 1.

TABLE 1

| Frequency (MHz) | Copper Mesh | Aluminum Mesh | Control Sample |
|---|---|---|---|
| (i) Near Field Attenuation* | | | |
| 30 | 42 | 37 | 0 |
| 50 | 42 | 37 | 0 |
| 100 | 41 | 35 | 0 |
| 300 | 56 | 32 | 2 |
| 500 | 56 | 31 | 1 |
| 1000 | 28 | 31 | 1 |
| (ii) Far Field Attenuation* | | | |
| 30 | 56 | 50 | 0 |
| 50 | 55 | 48 | 0 |
| 100 | 48 | 41 | 0 |
| 300 | 39 | 39 | 0 |
| 500 | — | 44 | 0 |
| 1000 | 45 | — | 0 |

*measured in decibels

Both the copper and aluminum wire meshes provided shielding against electromagnetic radiation, with the copper being more effective than aluminum alloy. In contrast, the control sample exhibited essentially no shielding effectiveness.

We claim:

1. A panel consisting essentially of:
   a) a planar substantially inflexible cellulosic substrate having an uneven surface; and
   b) at least one layer of at least one material selected from the group consisting of paper or veneer;
   c) a layer of at least one electrically conductive material selected from the group consisting of wire mesh and metal foil interposed between said substrate and said at least one layer, said conductive wire mesh or metal foil being formed from a metal selected from the group consisting of copper and aluminum; said substrate and said layers being bonded together with a polyolefin selected from the group consisting of (i) homopolymers of ethylene and copolymers of ethylene and at least one $C_4$–$C_{10}$ hydrocarbon alpha-olefin, and mixtures thereof, and having a melt index of less than 20 dg/min, (ii) copolymers of ethylene with at least one of vinyl acetate, acrylic acid, methacrylic acid, carbon monoxide, alkyl esters of acrylic acid and alkyl esters of methacrylic acid, and (iii) copolymers of ethylene with at least one unsaturated carboxylic acid, and mixtures of said polyolefins, said polyolefins of (i) and (ii) having been grafted with at least 9 ppm by weight of an ethylenically unsaturated carboxylic acid or anhydride.

2. The panel of claim 1 in which the polyolefin is selected from homopolymers of ethylene and copolymers of ethylene and at least one $C_4$–$C_{10}$ hydrocarbon alpha-olefin, and mixtures thereof, and having a melt index of less than 20 dg/min.

3. The panel of claim 2 in which the layer is wire mesh.

4. The panel of claim 2 in which the layer is metal foil.

5. The panel of claim 1 in which the layer of paper or veneer is kraft paper.

6. The panel of claim 1 in which the cellulosic substrate is oriented strand board.

* * * * *